(12) United States Patent
Huang et al.

(10) Patent No.: US 11,792,969 B2
(45) Date of Patent: Oct. 17, 2023

(54) PREVENTING GATE-TO-CONTACT BRIDGING BY REDUCING CONTACT DIMENSIONS IN FINFET SRAM

(71) Applicant: Taiwan Semiconductor Manufacturing Co., Ltd., Hsinchu (TW)

(72) Inventors: Shih-Han Huang, Hsinchu (TW); Chih-Hung Hsieh, Hsin-Chu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 375 days.

(21) Appl. No.: 16/046,188

(22) Filed: Jul. 26, 2018

(65) Prior Publication Data

US 2019/0006373 A1    Jan. 3, 2019

Related U.S. Application Data

(62) Division of application No. 15/636,832, filed on Jun. 29, 2017, now Pat. No. 11,545,495.

(51) Int. Cl.
*H01L 27/11*    (2006.01)
*H01L 27/02*    (2006.01)
(Continued)

(52) U.S. Cl.
CPC .......... *H10B 10/12* (2023.02); *G06F 30/392* (2020.01); *H01L 27/0207* (2013.01); *H01L 29/41775* (2013.01); *H01L 21/823821* (2013.01)

(58) Field of Classification Search
CPC .......... H01L 27/1104; H01L 29/41775; H01L 27/0207; H01L 21/823821;
(Continued)

(56) References Cited

U.S. PATENT DOCUMENTS 5,254,483 A    10/1993    Forgerson, II et al.
6,654,945 B1 *  11/2003    Nakayama .............. G06F 30/30
                                                                    716/55
(Continued)

FOREIGN PATENT DOCUMENTS

CN    102122660 A    7/2011
CN    102782857 A    11/2012
(Continued)

OTHER PUBLICATIONS

Kansal et.al., "Decreasing parasitic capacitance in IC layouts", Freescale Semiconductor, Jan. 4, 2014. (Year: 2014).*
(Continued)

*Primary Examiner* — Kevin Parendo
(74) *Attorney, Agent, or Firm* — HAYNES AND BOONE, LLP (57) ABSTRACT

A static random access memory (SRAM) cell includes a first gate and a second gate each extending in a first direction. A first gap separates the first gate from the second gate in the first direction. The SRAM cell includes a Vcc contact extending in the first direction. A second gap separates the Vcc contact and the first gate in a second direction perpendicular to the first direction. No segment of the Vcc contact overlaps with the first gap in the first direction. The SRAM cell includes a Vss contact extending in the first direction. A third gap separates the Vss contact from the first gate in the second direction. A segment of the Vss contact is disposed to the first gap. The Vss contact is smaller than the Vcc contact in the second direction.

20 Claims, 6 Drawing Sheets

(51) Int. Cl.
*G06F 30/392* (2020.01)
*H01L 29/417* (2006.01)
*H01L 21/8238* (2006.01)
*H10B 10/00* (2023.01)

(58) Field of Classification Search
CPC ......... H01L 21/76892; H01L 29/42376; H01L 29/785; H01L 2029/7858; G06F 17/5072; G06F 30/392; G03F 1/36; G03F 1/144
See application file for complete search history.

(56) References Cited

U.S. PATENT DOCUMENTS

| | | | |
|---|---|---|---|
| 6,791,128 B1* | 9/2004 | Yamauchi | G11C 11/412 257/E27.099 |
| 7,221,031 B2* | 5/2007 | Ryoo | G11C 11/412 257/393 |
| 7,282,772 B2* | 10/2007 | Anderson | H01L 21/823431 257/386 |
| 7,932,566 B2 | 4/2011 | Hou et al. | |
| 8,001,517 B2 | 8/2011 | Kobayashi | |
| 8,247,846 B2* | 8/2012 | Becker | H01L 21/76816 257/211 |
| 8,258,572 B2 | 9/2012 | Liaw | |
| 8,421,205 B2 | 4/2013 | Yang | |
| 8,464,186 B2* | 6/2013 | Wang | G03F 1/36 716/53 |
| 8,577,717 B2* | 11/2013 | Fu | G06Q 10/04 705/7.35 |
| 8,584,057 B2* | 11/2013 | Liu | G06F 30/398 716/53 |
| 8,605,523 B2 | 12/2013 | Tao et al. | |
| 8,630,132 B2 | 1/2014 | Cheng et al. | |
| 8,661,389 B2 | 2/2014 | Chern et al. | |
| 8,669,596 B2 | 3/2014 | Tamaru | |
| 8,698,205 B2 | 4/2014 | Tzeng et al. | |
| 8,760,948 B2 | 6/2014 | Tao et al. | |
| 8,826,212 B2 | 9/2014 | Yeh et al. | |
| 8,829,610 B2* | 9/2014 | Zhao | G06F 30/392 257/335 |
| 8,836,141 B2 | 9/2014 | Chi et al. | |
| 8,964,453 B2* | 2/2015 | Lin | G06F 30/392 365/154 |
| 9,075,936 B2* | 7/2015 | Chen | G06F 30/00 |
| 9,189,588 B2* | 11/2015 | Cheng | G03F 1/36 |
| 9,698,047 B2* | 7/2017 | Hung | H01L 21/76829 |
| 9,793,183 B1* | 10/2017 | Ho | H01L 22/20 |
| 9,899,263 B2 | 2/2018 | Hsieh et al. | |
| 9,934,347 B2 | 4/2018 | Seo et al. | |
| 10,026,726 B2 | 7/2018 | Hung et al. | |
| 2002/0108098 A1* | 8/2002 | Igeta | G03F 1/36 716/53 |
| 2003/0002328 A1 | 1/2003 | Yamauchi | |
| 2008/0276215 A1 | 11/2008 | Higuchi et al. | |
| 2010/0289091 A1 | 11/2010 | Takeda et al. | |
| 2011/0133285 A1 | 6/2011 | Liaw | |
| 2011/0317477 A1 | 12/2011 | Liaw | |
| 2012/0192135 A1* | 7/2012 | Gullette | G06F 30/398 716/113 |
| 2012/0262978 A1 | 10/2012 | Takahashi et al. | |
| 2013/0037888 A1 | 2/2013 | Han et al. | |
| 2013/0043553 A1* | 2/2013 | Chern | G06F 30/39 257/499 |
| 2013/0299905 A1 | 11/2013 | Lee | |
| 2014/0032871 A1 | 1/2014 | Hsu et al. | |
| 2014/0035056 A1* | 2/2014 | Liaw | H01L 27/0207 257/E27.098 |
| 2014/0151812 A1 | 6/2014 | Liaw | |
| 2014/0153321 A1 | 6/2014 | Liaw | |
| 2014/0153345 A1 | 6/2014 | Kim et al. | |
| 2014/0177352 A1 | 6/2014 | Lum | |
| 2014/0197485 A1 | 7/2014 | Hamaguchi | |
| 2014/0215420 A1 | 7/2014 | Lin et al. | |
| 2014/0233330 A1 | 8/2014 | Ko et al. | |
| 2014/0241077 A1 | 8/2014 | Katoch et al. | |
| 2014/0264924 A1 | 9/2014 | Yu et al. | |
| 2014/0269114 A1 | 9/2014 | Yang et al. | |
| 2014/0282289 A1 | 9/2014 | Hsu et al. | |
| 2014/0317581 A1* | 10/2014 | Chuang | H01L 21/0274 716/53 |
| 2014/0325466 A1 | 10/2014 | Ke et al. | |
| 2015/0061110 A1* | 3/2015 | Hsu | H01L 23/528 257/713 |
| 2015/0363540 A1* | 12/2015 | Lee | G06F 30/398 716/51 |
| 2016/0034627 A1 | 2/2016 | Cho et al. | |
| 2016/0063167 A1* | 3/2016 | Hamouda | G06F 30/398 716/122 |
| 2016/0232272 A1* | 8/2016 | Liu | G06F 30/392 |
| 2016/0240472 A1 | 8/2016 | Lin et al. | |
| 2017/0017745 A1 | 1/2017 | Wang et al. | |
| 2017/0083654 A1* | 3/2017 | Chuang | G06F 30/392 |
| 2017/0098609 A1* | 4/2017 | Harrington, III | H01L 21/28518 |
| 2017/0110455 A1 | 4/2017 | Yamamoto | |
| 2018/0096090 A1 | 4/2018 | Wu | |
| 2018/0151567 A1* | 5/2018 | Lin | H01L 27/11807 |
| 2018/0182766 A1* | 6/2018 | Huang | H01L 27/1104 |
| 2018/0261604 A1 | 9/2018 | Woo et al. | |
| 2018/0286872 A1 | 10/2018 | Chen et al. | |
| 2018/0308853 A1 | 10/2018 | Bell et al. | |
| 2018/0315762 A1 | 11/2018 | Kim et al. | |
| 2019/0026417 A1* | 1/2019 | de Dood | G06F 30/398 |

FOREIGN PATENT DOCUMENTS

| | | |
|---|---|---|
| CN | 106257674 A | 12/2016 |
| JP | 2006276079 A | 10/2006 |
| KR | 20130017344 A | 2/2013 |
| KR | 20140070306 | 6/2014 |
| KR | 20170009677 | 1/2017 |
| TW | 201342535 A | 10/2013 |
| TW | 201606942 A | 2/2016 |
| TW | 201701413 A | 1/2017 |

OTHER PUBLICATIONS

Hu, "MOSFETs in ICs-Scaling, Leakage, and Other Topics", ch07v3frm, p. 259, Feb. 13, 2009 (Year: 2009).*

F. Forero, J. Galliere, M. Renovell and V. Champac, "Analysis of short defects in FinFET based logic cells," 2017 18th IEEE Latin American Test Symposium (LATS), Bogota, 2017, doc: Mar. 13-15, 2017, pp. 1-6.doi: 10.1109/LATW.2017.7906755 (Year: 2017).

* cited by examiner

PREVENTING GATE-TO-CONTACT BRIDGING BY REDUCING CONTACT DIMENSIONS IN FINFET SRAM

PRIORITY DATA

This application is a divisional of U.S. application Ser. No. 15/636,832, filed Jun. 29, 2017, which is herein incorporated by reference in its entirety.

BACKGROUND

In deep sub-micron integrated circuit technology, an embedded static random access memory (SRAM) device has become a popular storage unit of high speed communication, image processing and system-on-chip (SOC) products. The amount of embedded SRAM in microprocessors and SOCs increases to meet the performance requirement in each new technology generation. As silicon technology continues to scale from one generation to the next, the impact of intrinsic threshold voltage (Vt) variations in minimum geometry size bulk planar transistors reduces the complimentary metal-oxide-semiconductor (CMOS) SRAM cell static noise margin (SNM). This reduction in SNM caused by increasingly smaller transistor geometries is undesirable. SNM is further reduced when Vcc is scaled to a lower voltage.

To solve SRAM issues and to improve cell shrink capability, fin field effect transistor (FinFET) devices are often considered for some applications. The FinFET provides both speed and device stability. The FinFET has a channel (referred to as a fin channel) associated with a top surface and opposite sidewalls. Benefits can be derived from the additional sidewall device width ($I_{on}$ performance) as well as better short channel control (sub-threshold leakage). Therefore, FinFETs are expected to have advantages in terms of gate length scaling and intrinsic $V_t$ fluctuation. However, existing FinFET SRAM devices still have shortcomings, for example shortcomings related to undesirable variations at gate end positions, which could degrade gate/contact isolation and adversely impact FinFET SRAM performance and/or reliability.

Therefore, although existing FinFET SRAM devices have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion. It is also emphasized that the drawings appended illustrate only typical embodiments of this invention and are therefore not to be considered limiting in scope, for the invention may apply equally well to other embodiments.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure is directed to, but not otherwise limited to, a fin-like field-effect transistor (FinFET) device. The FinFET device, for example, may be a complementary metal-oxide-semiconductor (CMOS) device including a P-type metal-oxide-semiconductor (PMOS) FinFET device and an N-type metal-oxide-semiconductor (NMOS) FinFET device. The following disclosure will continue with one or more FinFET examples to illustrate various embodiments of the present disclosure. It is understood, however, that the application should not be limited to a particular type of device, except as specifically claimed.

Figure 1:
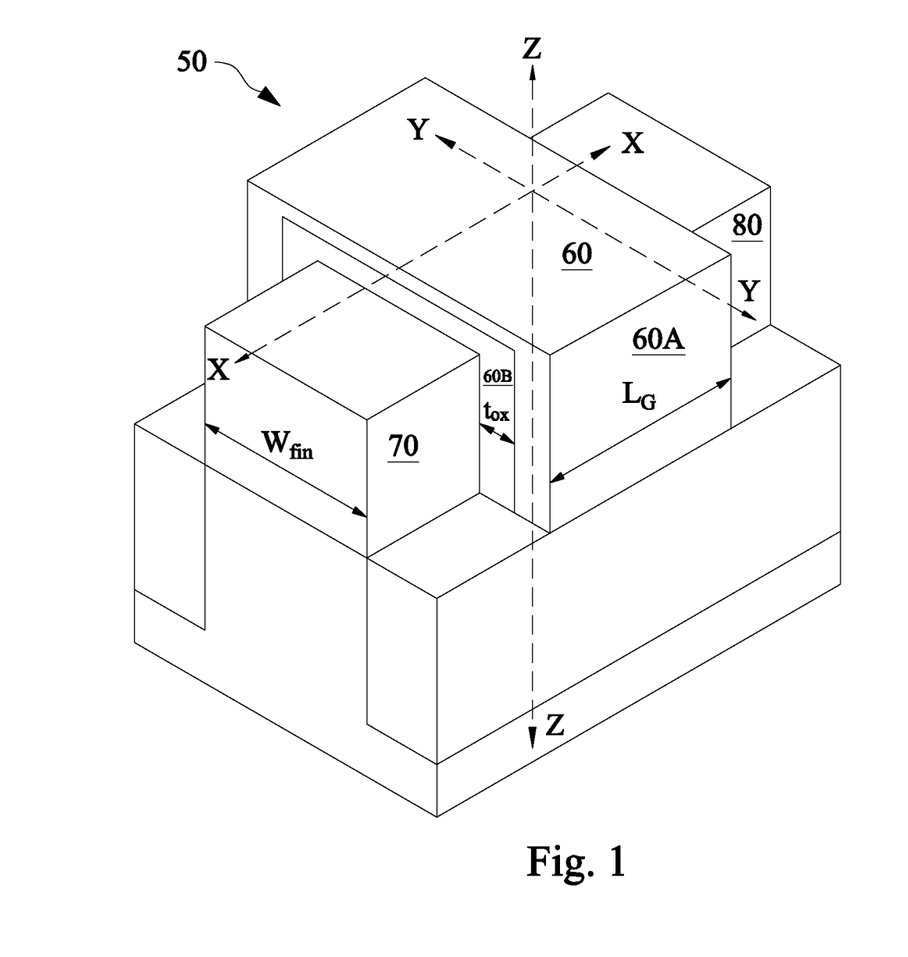
FIG. 1 is a perspective view of an example FinFET device.

The use of FinFET devices has been gaining popularity in the semiconductor industry. Referring to FIG. 1, a perspective view of an example FinFET device 50 is illustrated. The FinFET device 50 is a non-planar multi-gate transistor that is built over a substrate (such as a bulk substrate). A thin silicon-containing "fin-like" structure (hereinafter referred to as a "fin") forms the body of the FinFET device 50. The fin extends along an X-direction shown in FIG. 1. The fin has a fin width $W_{fin}$ measured along a Y-direction that is orthogonal to the X-direction. A gate 60 of the FinFET device 50 wraps around this fin, for example around the top surface and the opposing sidewall surfaces of the fin. Thus, a portion of the gate 60 is located over the fin in a Z-direction that is orthogonal to both the X-direction and the Y-direction.

$L_G$ denotes a length (or width, depending on the perspective) of the gate 60 measured in the X-direction. The gate 60 may include a gate electrode component 60A and a gate dielectric component 60B. The gate dielectric 60B has a thickness $t_{ox}$ measured in the Y-direction. A portion of the gate 60 is located over a dielectric isolation structure such as shallow trench isolation (STI). A source 70 and a drain 80 of the FinFET device 50 are formed in extensions of the fin on opposite sides of the gate 60. A portion of the fin being wrapped around by the gate 60 serves as a channel of the FinFET device 50. The effective channel length of the FinFET device 50 is determined by the dimensions of the fin.

FinFET devices offer several advantages over traditional Metal-Oxide Semiconductor Field Effect Transistor (MOSFET) devices (also referred to as planar transistor devices). These advantages may include better chip area efficiency, improved carrier mobility, and fabrication processing that is compatible with the fabrication processing of planar devices. Thus, it may be desirable to design an integrated circuit (IC) chip using FinFET devices for a portion of, or the entire IC chip.

However, traditional FinFET devices may still have shortcomings. For example, as semiconductor feature sizes continue to shrink, the variation in the gate profile—especially the end portions of the gate—may cause unintentional bridging between the gate and nearby conductive contacts. In SRAM devices, this bridging may manifest itself as bridging between the gate and Vss or node contacts. According to the various aspects of the present disclosure, the dimensions of the Vss and node contacts are shrunk in order to reduce the bridging risk, as discussed in more detail below.

Figure 2:
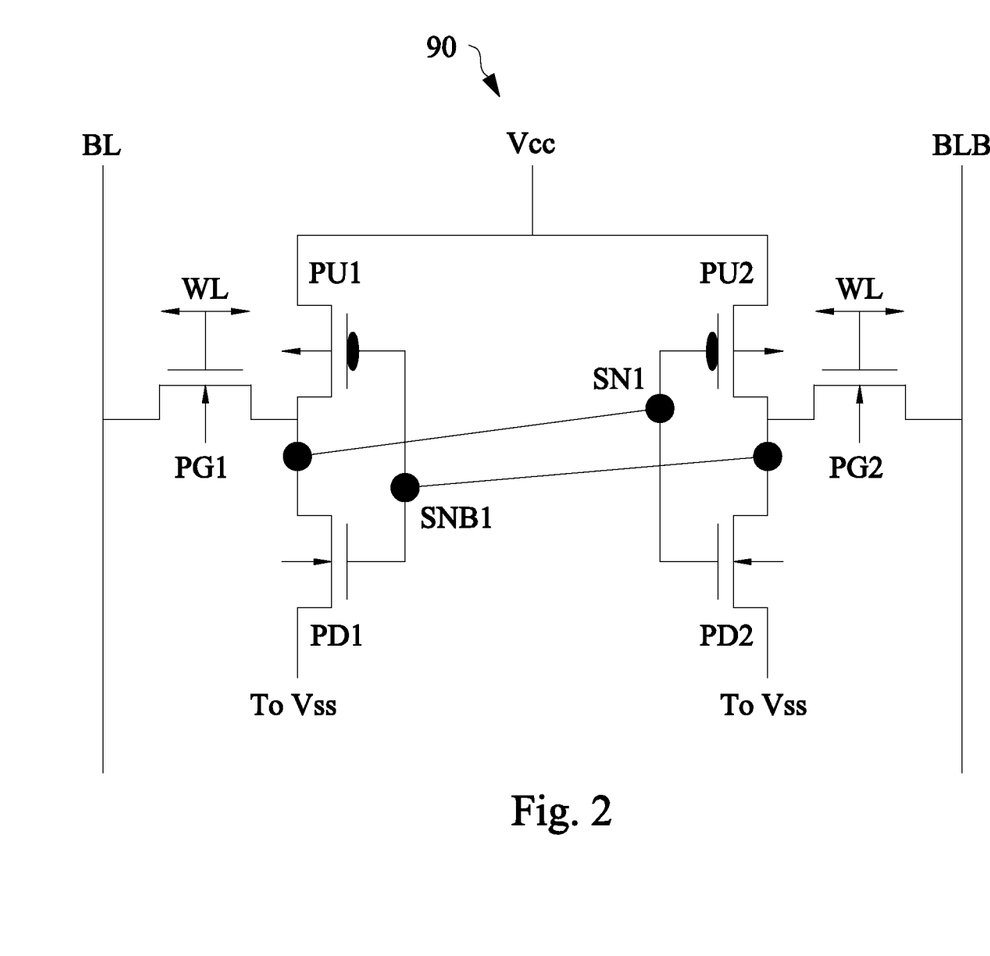
FIG. 2 illustrates a circuit schematic for a 1-bit SRAM cell according to an embodiment of the present disclosure.

FIG. 2 illustrates a circuit schematic for a single-port SRAM cell (e.g., 1-bit SRAM cell) 90. The single-port SRAM cell 90 includes pull-up transistors PU1, PU2; pull-down transistors PD1, PD2; and pass-gate transistors PG1, PG2. As show in the circuit diagram, transistors PU1 and PU2 are p-type transistors, such as the p-type FinFETs discussed above, and transistors PG1, PG2, PD1, and PD2 are n-type FinFETs discussed above.

The drains of pull-up transistor PU1 and pull-down transistor PD1 are coupled together, and the drains of pull-up transistor PU2 and pull-down transistor PD2 are coupled together. Transistors PU1 and PD1 are cross-coupled with transistors PU2 and PD2 to form a first data latch. The gates of transistors PU2 and PD2 are coupled together and to the drains of transistors PU1 and PD1 to form a first storage node SN1, and the gates of transistors PU1 and PD1 are coupled together and to the drains of transistors PU2 and PD2 to form a complementary first storage node SNB1. Sources of the pull-up transistors PU1 and PU2 are coupled to power voltage Vcc (also referred to as Vdd), and the sources of the pull-down transistors PD1 and PD2 are coupled to a voltage Vss, which may be an electrical ground in some embodiments.

The first storage node SN1 of the first data latch is coupled to bit line BL through pass-gate transistor PG1, and the complementary first storage node SNB1 is coupled to complementary bit line BLB through pass-gate transistor PG2. The first storage node N1 and the complementary first storage node SNB1 are complementary nodes that are often at opposite logic levels (logic high or logic low). Gates of pass-gate transistors PG1 and PG2 are coupled to a word line WL.

Figure 3:
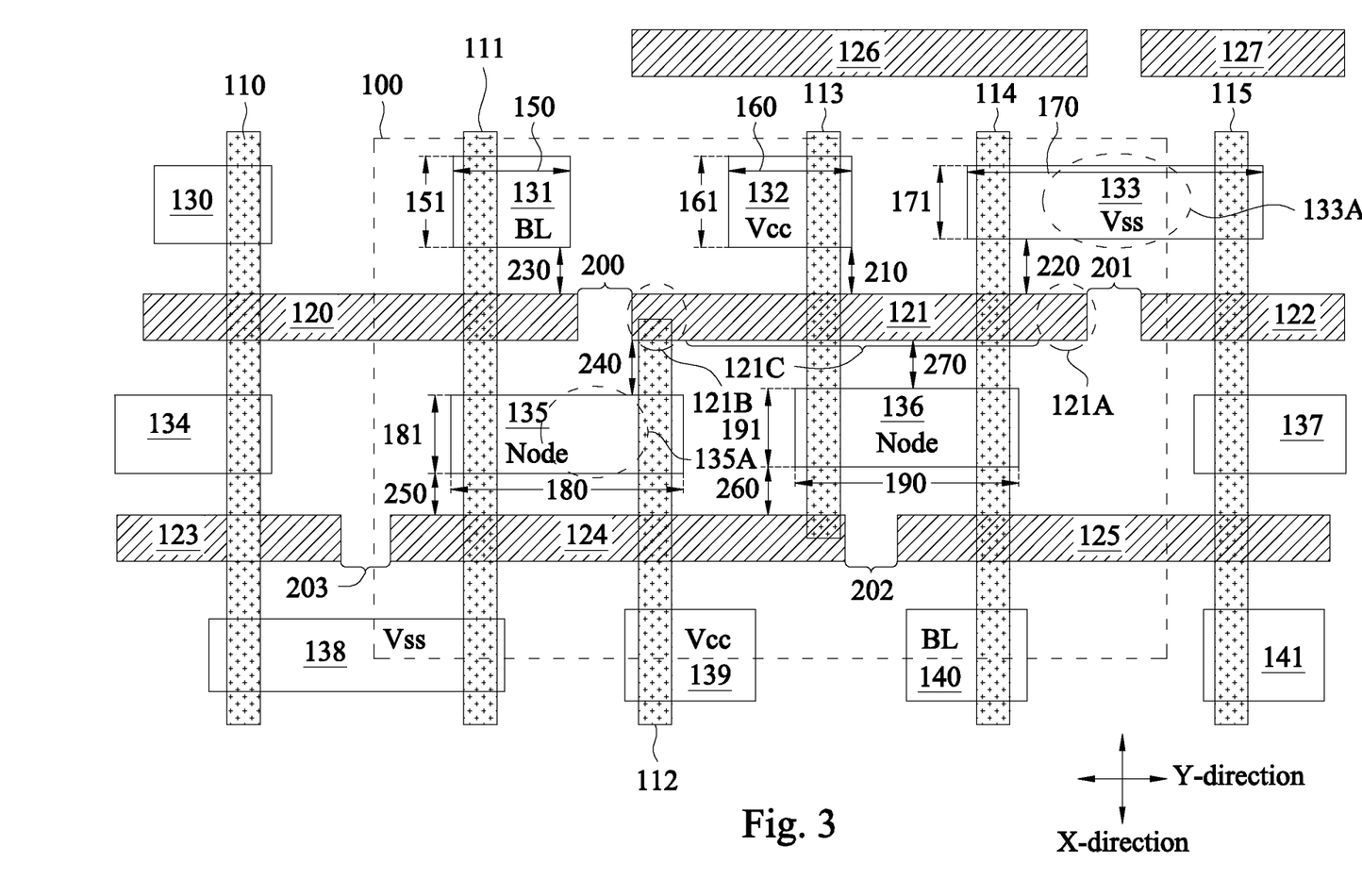
FIG. 3 illustrates a top view of the 1-bit SRAM cell according to an embodiment of the present disclosure.

FIG. 3 illustrates a fragmentary top view of SRAM cells according to an embodiment of the present disclosure. The SRAM cells include a plurality of cells, such as a 1-bit SRAM cell 100 (as an example), the circuit schematic of which is shown in FIG. 2 as circuit schematic 90. The elements of the SRAM cell 100 are shown in the top view of FIG. 3 within a box with dashed boundary lines.

The SRAM cells include a plurality of fin lines 110-115 (also referred to as active region, or OD). As shown in FIG. 3, four fin lines 111-114 are located within (or as a part of) the SRAM cell 100 and each extend in the X-direction (also shown in FIG. 1). The fin lines 111-114 contain a semiconductor material, such as silicon or silicon germanium. In some embodiments, the fin lines 111 and 114 are fin lines for the pull-down transistors, and the fin lines 112 and 113 are the fin lines for the pull-up transistors.

The SRAM cells also include a plurality of elongated gate structures (also referred to as gate lines) 120-127 that each extend in the Y-direction (also shown in FIG. 1). The gate structures 120-127 each wrap around one or more of the fin lines 110-115 in the manner discussed above with reference to FIG. 1. Two continuous gate structures 121 and 124 are disposed entirely within the SRAM cell 100. The gate structures 120 and 125 also each partially extend into the SRAM cell 100. The gate structures 120, 121, 124, and 125 and the fin lines 111-114 collectively form at least six transistor devices, for example the PD1, PD2, PG1, PG2, PU1, and PU2 transistor devices of the SRAM cell discussed above with reference to FIG. 2.

A plurality of conductive contacts 130-141 are also shown in the top view of FIG. 3. Disposed within (at least partially within) the SRAM cell 100 are a bit-line (BL) contact 131, a Vcc (also referred to as Vdd) contact 132, a Vss (also referred to as ground) contact 133, a node contact 135, a node contact 136, a Vss contact 138, a Vcc contact 139, and a BL contact 140. As shown in FIG. 3, the BL contact 131 has a dimension 150 measured in the Y-direction and a dimension 151 measured in the X-direction, the Vcc contact 132 has a dimension 160 measured in the Y-direction and a dimension 161 measured in the X-direction, the Vss contact 133 has a dimension 170 measured in the Y-direction and a dimension 171 measured in the X-direction, the node contact 135 has a dimension 180 measured in the Y-direction and a dimension 181 measured in the X-direction, and the node contact 136 has a dimension 190 measured in the Y-direction and a dimension 191 measured in the X-direction.

In some embodiments, the dimension 150 of the BL contact 131 is smaller than about 100 nanometers (nm). The dimension 150 is also smaller than the dimension 170 of the Vss contact 133 and smaller than the dimension 180 of the node contact 135. In some embodiments, a ratio between the dimension 150 and the dimension 170 is less than about 0.5, and a ratio between the dimension 150 and the dimension 180 is less than about 0.7. These ratio ranges are optimized for SRAM cell design and performance.

In some embodiments, the dimension 160 of the Vcc contact 132 is smaller than about 40 nanometers (nm). The dimension 160 is also smaller than the dimension 170 of the Vss contact 133 and smaller than the dimension 180 of the node contact 135. In some embodiments, a ratio between the dimension 160 and the dimension 170 is less than about 0.4, and a ratio between the dimension 160 and the dimension 180 is less than about 0.6. These ratio ranges are optimized for SRAM cell design and performance.

In some embodiments, the dimension 151 of the BL contact 131 is greater than the dimension 171 of the Vss contact 133 and greater than the dimension 181 of the node contact 135. In some embodiments, the dimension 151 is greater than the dimension 171 by at least about 0.5 nm, and the dimension 151 is greater than the dimension 181 by at least about 0.5 nm. In some embodiments, the dimension 161 of the Vcc contact 132 is greater than the dimension 171 of the Vss contact 133 and greater than the dimension 181 of the node contact 135. In some embodiments, the dimension 161 is greater than the dimension 171 by at least about 0.5 nm, and the dimension 161 is greater than the dimension 181 by at least about 0.5 nm. The dimension 171 of the Vss contact 133 may also be smaller than the dimension 181 of the node contact 135. In some embodiments, the dimension 171 is smaller than the dimension 181 by at least about 0.1 nm. As discussed in greater detail below, these dimension ranges are specifically configured to reduce the risk of undesirable gate-to-contact bridging.

As shown in FIG. 3, the gate lines 120, 121, and 121 are substantially aligned with one another in the X-direction, and the gate lines 123, 124, and 125 are substantially aligned with one another in the X-direction. The gate structures 120 and 121 are separated by a gap 200 in the Y-direction, the gate structures 121 and 122 are separated by a gap 201 in the Y-direction, and the gate structures 124 and 125 are separated by a gap 202 in the Y-direction. The gate structure 121 is separated from the Vcc contact 132 by a gap 210 in the X-direction, the gate structure 121 is separated from the Vss contact 133 by a gap 220 in the X-direction, the gate structure 120 is separated from the BL contact 131 by a gap 230 in the X-direction, the gate structure 121 is separated from the node contact 135 by a gap 240 in the X-direction, the gate structure 124 is separated from the node contact 135 by a gap 250 in the X-direction, the gate structure 124 is separated from the node contact 136 by a gap 260 in the X-direction, and the gate structure 121 is separated from the node contact 136 by a gap 270 in the X-direction.

As discussed above, one aspect of the present disclosure involves reducing the likelihood of undesirable contact and gate bridging. In more detail, due to process control limitations, the dimensions of the gate structures 120-125 may vary. For example, a width (measured in the X-direction) of the gate structures 120-125 may vary from device to device. This gate width variation may be even more pronounced or significant at an end portion of the gate structure. Using the gate structure 121 as an example, it has two opposite end portions 121A and 121B, which are joined together by a non-end portion 121C. In some embodiments, the end portion 121A or 121B may each have a length (measured in the Y-direction starting from an end tip and extending inwards towards a center of the gate structure 121) that is about 0%-20% of the total length of gate structure 121. In other embodiments, the number may vary from about 0% to 10%. Due to process control limitations, the width variations (in the X-direction) may be more significant at the end portions 121A or 121B of the gate structure 121.

As shown in FIG. 3, the end portion 121A of the gate structure 121 is located adjacent to a non-end segment 133A of the Vss contact 133, and the end portion 121B is located adjacent to a non-end segment 135A of the node contact 135. In some embodiments, the segment 133A may refer to any portion of the Vss contact that is within 40% of the total length (e.g., dimension 170) of the Vss contact 133 from a center of the Vss contact 133 (in either side of the center along the Y-direction). Likewise, in some embodiments, the segment 135A may refer to any portion of the node contact that is within 40% of the total length (e.g., dimension 180) of the node contact 135 from a center of the node contact 135 (in either side of the center along the Y-direction). The segment 135A may overlap (but without touching) with the gap 200 in the Y-direction. In other words, the segment 135A is disposed adjacent to, or nearby, the end portions of the gate structures 120-121. It may also be said that the segment 135A is disposed adjacent to the gap 200.

As the width of the end portions 121A-121B of the gate structure 121 increases due to process control limitations, gate-to-contact bridging risks increase, and these bridging risks are higher at locations of the SRAM cell where a gate structure's end portion is disposed near or adjacent to a non-end portion of a conductive contact. Alternatively stated, bridging is more likely to occur in areas where gaps between adjacent gate structures overlap with a non-end region of a conductive contact, for example where the gap 200 overlaps with (e.g., disposed adjacent to but without touching) a non-end portion of the node contact 135 in the Y-direction, or where the gap 201 overlaps with (e.g., disposed adjacent to but without touching) a non-end portion of the Vss contact 133 in the Y-direction, or where the gap 202 overlaps with (e.g., disposed adjacent to but without touching) a non-end portion of the node contact 136 in the Y-direction, or where the gap 203 overlaps with (e.g., disposed adjacent to but without touching) a non-end portion of the Vss contact 138 in the Y-direction.

Specifically, the end portion 121A may run the risk of bridging with the middle segment 133A of the Vss contact 133, and the end portion 121B may run the risk of bridging with the middle segment 135A of the node contact 135. Similarly, an end portion of the gate structure 120 may potentially bridge with the node contact 135, an end portion of the gate structure 122 may potentially bridge with the Vss contact 133, an end portion of the gate structure 124 may potentially bridge with the Vss contact 138, and end portions of the gate structures 124 and 125 may potentially bridge with the node contact 136.

Gate-to-contact bridging is undesirable because it may degrade SRAM cell performance and reliability or may even render the SRAM cell defective.

Unfortunately, conventional SRAM cell design and fabrication have not adequately taken this issue into account or provided a satisfactory solution. According to the various aspects of the present disclosure, however, the Vss contacts 133/138 and the node contacts 135/136 (where bridging is at a risk) are shrunk in the X-direction, so as to reduce the possibility of them bridging with the adjacent gate structure(s).

For example, the dimension 171 of the Vss contact 133 is reduced compared to the dimension 151 of the BL contact 131 or the dimension 161 of the Vcc contact 132. In some embodiments, the dimension 151 and the dimension 161 are each greater than the dimension 171 by at least 0.5 nm. As a result of the reduced dimension 171 of the Vss contact 133, the gap 220 between the Vss contact 133 and the gate structure 121 is also larger than the gap 210 between the Vcc contact 132 and the gate structure 121 (or larger than the gap 230 between the BL contact 131 and the gate structure 120). In some embodiments, the gap 220 is larger than the gap 210 or the gap 230 by at least about 0.2 nm.

The smaller dimension 171 (or conversely, the larger gap 220) allows for a greater tolerance of the profile variation of the gate structure 121. Even if the end portion 121A of the gate structure is enlarged due to process control imperfections, it may still not come into physical contact with the Vss contact 133, since the boundary of the shrunken Vss contact 133 is effectively located "farther away" from the end portion 121A of the gate structure 121. Likewise, the shrunken Vss contact 133 also has reduced bridging risks with the gate structure 122. It is understood that the Vss contact 138 is also shrunken in a manner similar to the Vss contact 133, and as such it has a lower bridging risk with the gate structures 123/124.

With respect to the node contacts 135/136, the dimensions 181 and 191 of their respective node contacts 135-136 are reduced compared to the dimension 151 of the BL contact 131 or the dimension 161 of the Vcc contact 132. In some embodiments, the dimension 151 and the dimension 161 are each greater than the dimension 181 or 191 by at least 0.5 nm. As a result of the reduced dimension 181 of the node contact 135, the gap 240 between the node contact 135 and the gate structure 121 is also larger than the gap 210 between the Vcc contact 132 and the gate structure 121 (or larger than the gap 230 between the BL contact 131 and the gate structure 120). In some embodiments, the gap 240 is larger than the gap 210 or the gap 230 by at least about 0.1 nm.

With respect to the node contact 136, as a result of the reduced dimension 191 of the node contact 136, the gap 260 between the node contact 136 and the gate structure 124 is also larger than the gap 210 between the Vcc contact 132 and the gate structure 121 (or larger than the gap 230 between the BL contact 131 and the gate structure 120). In some embodiments, the gap 260 is larger than the gap 210 or the gap 230 by at least about 0.1 nm.

The smaller dimensions 181 and 191 (or conversely, the larger gaps 240 and 260) allow for a greater tolerance of the profile variation of the gate structures 120-121 and 124-125. For example, even if the end portion 121B of the gate structure is enlarged due to process control imperfections, it may still not come into physical contact with the node contact 135, since the boundary of the shrunken node contact 135 is effectively located "farther away" from the end portion 121B of the gate structure 121. Likewise, the shrunken node contact 135 also has reduced bridging risks with the gate structure 120. Similarly, the shrunken node contact 136 also has reduced bridging risks with the gate structures (e.g., the end portions thereof) 124-125.

In some embodiments, the node contacts 135-136 are misaligned in the X-direction. In other words, the gap 240 is larger than the gap 270, and the gap 260 is larger than the gap 250. This misalignment is due to the fact that the bridging concerns for the node contact 135 is with respect to the gate structures 120-121 (i.e., gate structure end portions located near the gaps 240 or 200), whereas the bridging concerns for the node contact 136 is with respect to the gate structures 124-125 (i.e., gate structure end portions located near the gaps 260 or 202). In other words, while it may be beneficial for the node contact 135 to be located farther away from the gate structures 120-121, it is not as important for the node contact 135 to be located farther away from the gate structure 124. As such, the node contact 135 may be shrunken from the "top side" (the side facing the gap 200), but not shrunken from the "bottom side" (the side facing the gate structure 124). Likewise, while it may be beneficial for the node contact 136 to be located farther away from the gate structures 124-125, it is not as important for the node contact 136 to be located farther away from the gate structure 121. As such, the node contact 136 may be shrunken from the "bottom side" (the side facing the gap 202), but not shrunken from the "top side" (the side facing the gate structure 121). It is understood, however, that this is merely one possible embodiment. In other embodiments, the node contacts 135-136 may be shrunken from both the "top side" and the "bottom side".

Compared to the node contacts 13-136, the Vss contacts 133 and 138 may be shrunken from both the "top side" and the "bottom side." This is due to the fact that gate structures 126-127—similar to the gate structures 121-122—are located "above" the Vss contact 133 in the top view of FIG. 3. In some embodiments, the SRAM cell located immediately "above" the SRAM cell 100 is an "upside-down-flipped" version of the SRAM cell 100. In other words, the SRAM cell located immediately "above" the SRAM cell 100 mirrors the SRAM cell 100, except that the components inside that SRAM cell are "flipped" in 180 degrees in the X-direction compared to the components inside the SRAM cell 100. As such, the Vss contact 133 may also have bridging concerns with the gate structures 126-127. Thus, according to the various aspects of the present disclosure, the Vss contact 133 may be separated from the gate structure 126 by a gap similar to the gap 220 (e.g., substantially equal in size). In order to minimize the bridging risks between the Vss contact 133 and the gate structures 126-127, the dimension 171 of the Vss contact 133 is reduced from both the "top" and "bottom" sides. In other words, the gap 220 between the Vss contact 133 and the gate structure 126 is enlarged to avoid potential physical contact between the Vss contact 133 and the gate structures 126-127, even if the gate structures 126-127 have larger end portions due to process control imperfections. The same is true for the Vss contact 138 with respect to its adjacent gate structures.

Due to the fact that the Vss contacts 133 and 138 are size-reduced from both the "top side" and the "bottom side", whereas the node contacts 135-136 only need to be reduced from one side (e.g., the "top" side for the node contact 135 and the "bottom" side for the node contact 136), the dimension 171 (of the Vss contacts 133 or 138) is smaller than the dimension 181 (of the node contact 135) and the dimension 191 (of the node contact 136) as well. In some embodiments, the dimension 181 is larger than the 171 by at least about 0.1 nm, and the dimension 191 is larger than the 171 by at least about 0.1 nm.

Compared to the Vss contacts 133/138 and the node contacts 135/136, the BL contacts 131/140 and the Vcc contacts 132/139 are not as prone or susceptible to gate-to-contact bridging. This is because the BL contacts 131/140 and the Vcc contacts 132/139 are not located adjacent to the end portions of any of the gate structures 120-125 in the SRAM cell 100. For example, no segment of the Vcc contact 132 overlaps with any of the gaps 200 or 201 in the Y-direction. The same is true for the Vcc contact 139 as well as the BL contacts 131 and 140. As such, the BL contacts 131/140 and the Vcc contacts 132/139 have a larger window for gate-to-contact bridging. Therefore, it is not necessary to reduce their dimensions 151 or 161.

In some embodiments, the dimensions 151 or 161 may stay the same as the original SRAM cell design. In other embodiments, the dimensions 151 or 161 may actually be increased slightly from the original SRAM cell design. For example, whereas the dimension 151 of the BL contact 131 is M nanometers according to the original SRAM cell design, the present disclosure may reconfigure the design and/or fabrication of the BL contact 131 such that the dimension 151 is now M+N nanometers. In some embodiments, N may be in a range from about 0 nm to about 0.5 nm. The increased dimension 151 of the BL contact 131 may improve device performance, such as reduced contact resistance (due to the larger size). This may be particularly helpful if the dimension 150 of the BL contact 131 is small (since small contacts have greater contact resistance). For similar reasons, the dimension 161 of the Vcc contact 132 may be reconfigured such that it is larger than the value dictated by the original SRAM cell design.

Figure 4:
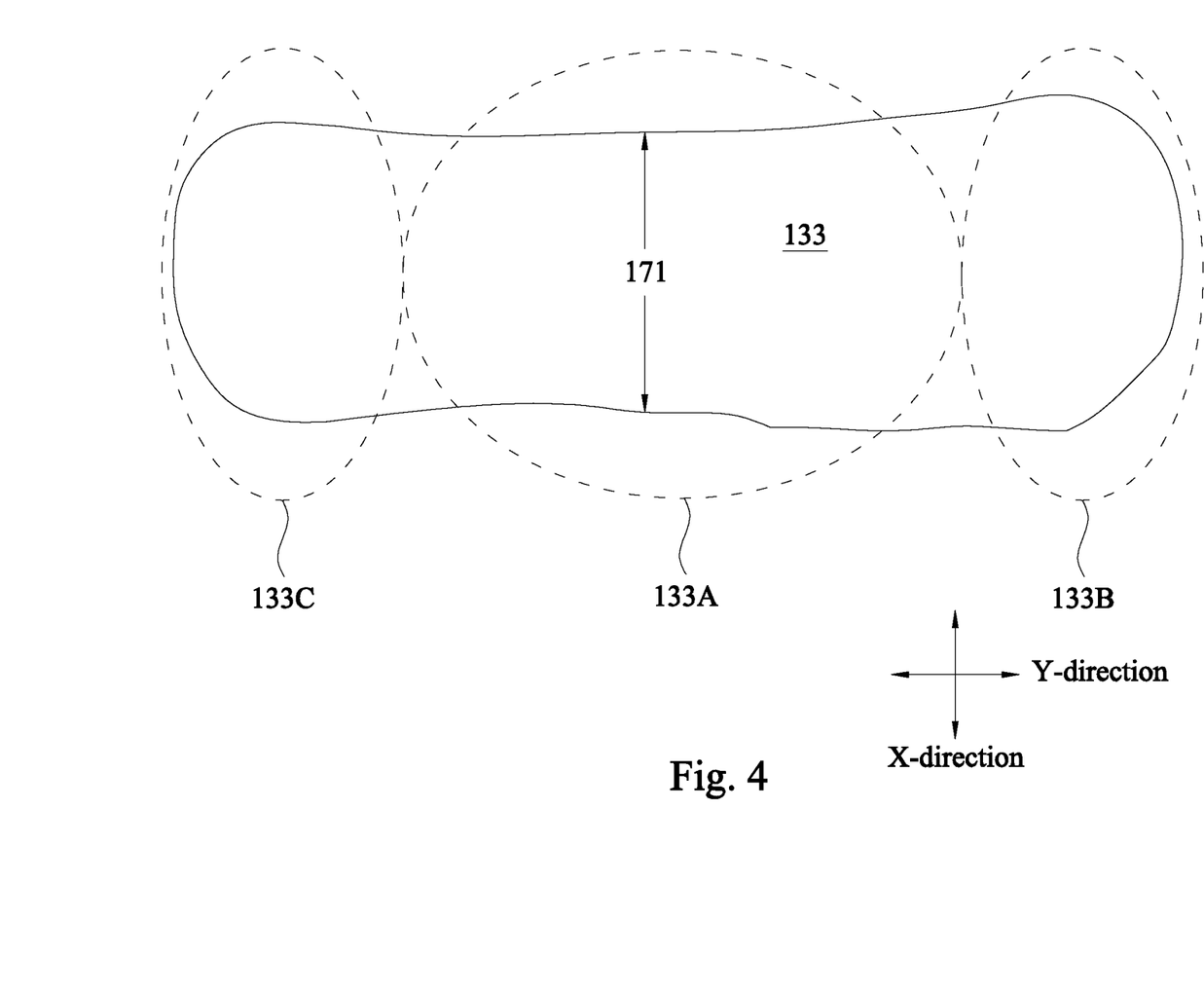
FIG. 4 illustrates an example of actually-fabricated conductive contact of the SRAM cell according to an embodiment of the present disclosure.

It is understood that although the elements in FIG. 3 appear as rectangles, the actually fabricated devices may not have such perfect shapes. For example, the boundaries of the elements (e.g., the fins, the contacts, or the gate structures)

may not be perfectly straight and may have roughness or non-linearity associated therewith. An example of this is shown in FIG. 4, in which a top view of an actually fabricated Vss contact 133 is illustrated according to an embodiment. As can be seen from FIG. 4, the actually fabricated Vss contact 133 is not a perfect triangle but has more of a "T-shape" (or a "dog-bone") top view profile. That is, not only does the Vss contact have somewhat curvilinear edges/boundaries, its middle portion 133A is also narrower (in the X-direction) than its end portions 133B or 133C.

In some embodiments, the narrower middle portion 133A is specifically configured to further reduce the bridging concerns. With reference to both FIGS. 3-4, the middle portion 133A is the segment of the Vss contact 133 that is disposed adjacent to the gap 201 defined by the end portions of the gate structures 121-122. In other words, the middle portion 133A is the part of the Vss contact 133 that is most at risk of bridging with the gate structures 121-122. Thus, by configuring the profile of the Vss contact 133 such that its middle portion "caves inward", bridging risks between the Vss contact 133 and the gate structures 121-122 are further minimized. In the embodiment illustrated in FIG. 4, the dimension 171 is measured somewhere in the middle portion 133A, for example at its narrowest point. However, it is understood that the dimension 171 may be measured in the end portions 133B or 133C in other embodiments.

Figure 5:
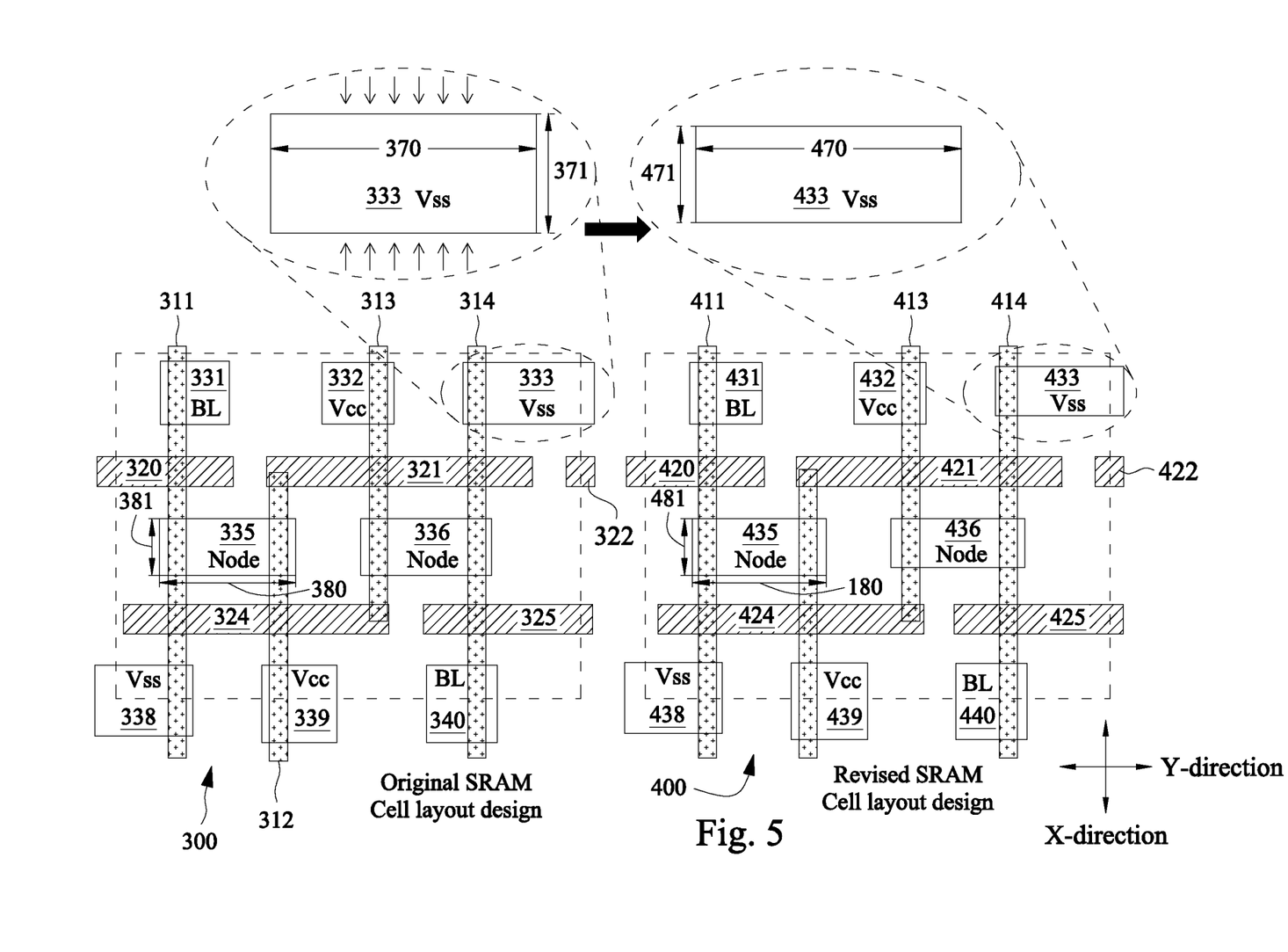
FIG. 5 illustrates an original 1-bit SRAM cell layout design and a revised 1-bit SRAM cell layout design based on the original 1-bit SRAM cell layout design according to an embodiment of the present disclosure.

In some embodiments, the shrinking of the Vss contacts 133/138 and the node contacts 135/136 is accomplished by revising the original SRAM cell layout design. An example of this approach is illustrated in FIG. 5, which illustrates an original 1-bit SRAM cell layout design 300, as well as a revised 1-bit SRAM cell layout design 400. In some embodiments, the original SRAM cell layout design 300 includes a computer file, such as a GDS (graphical database system) file, and the revised SRAM cell layout design 400 includes a photomask design. For example, the IC chip design and/or layout engineers may generate the original SRAM cell layout design 300 and send the design to a semiconductor fabrication entity, such as a foundry. The semiconductor fabrication entity will then design and/or manufacture a photomask, on which the original SRAM cell layout design 300 has been revised into the revised SRAM cell layout design 400. It is understood that in some embodiments, additional elements such as OPC (optical proximity correction) features may be implemented on the photomask.

As shown in FIG. 5, the original SRAM cell layout design 300 and the revised SRAM cell layout design 400 include respective fin lines 311-314 and 411-414 that correspond to the fin lines 111-114 of the SRAM cell 100 discussed above with reference to FIG. 3. The original SRAM cell layout design 300 and the revised SRAM cell layout design 400 also include respective gate structures 320-325 and 420-425 that correspond to the gate structures 120-125 of the SRAM cell 100 discussed above with reference to FIG. 3. The original SRAM cell layout design 300 and the revised SRAM cell layout design 400 further include respective conductive contacts 331-340 and 431-440 that correspond to the conductive contacts 131-140 of the SRAM cell 100 discussed above with reference to FIG. 3.

As discussed above, in order to minimize gate-to-contact bridging risks, the Vss contacts and the node contacts are shrunk in the X-direction. Using the Vss contact as an example, the Vss contact 333 in the original SRAM cell layout design 300 has a dimension 370 measured in the Y-direction and a dimension 371 measured in the X-direction. As a part of revising the original SRAM cell layout design 300, the dimension 371 is reduced to a dimension 471 for the revised Vss contact 433. In the embodiment shown in FIG. 5, the reduction of the dimension 371 is performed on both the "top side" and the "bottom side" of the Vss contact 333, as represented by the arrows on the "top side" and the "bottom side" of the Vss contact 333. In other embodiments, the reduction of the dimension 371 may be performed on one side (i.e., either the "top side" or the "bottom side"), but not the other. In some embodiments, the dimension 371 is greater than the dimension 471 by at least about 0.5 nm. Meanwhile, the dimension 370 is kept the same. In other words, the dimension 470 (measured in the Y-direction) of the revised Vss contact 433 is substantially equal to the dimension 370. It is understood that the Vss contact 338 of the original SRAM cell layout design 300 is shrunk to the Vss contact 438 of the revised SRAM cell layout design 400.

Furthermore, the node contacts 335-336 are shrunk into the node contacts 435-436 similarly, although the node contacts 335-336 do not need to be shrunk from both the "top side" and the "bottom side." For example, as discussed in more detail reference to FIG. 3, the bridging risk for the node contact 335 is higher from the "top side" (facing the gate structures 320-321), and as such the node contact 335 having a dimension 381 only needs to be shrunk from the "top side" to form the revised node contact 435 having a dimension 481. Similarly, the bridging risk for the node contact 336 is higher from the "bottom side" (facing the gate structures 324-325), and as such the node contact 336 only needs to be shrunk from the "bottom side" to form the revised node contact 436. However, it is understood that in some embodiments, the node contacts 335-336 may each be shrunk from both the "top side" and the "bottom side" to form the revised node contacts 435-436, respectively.

Figure 6:
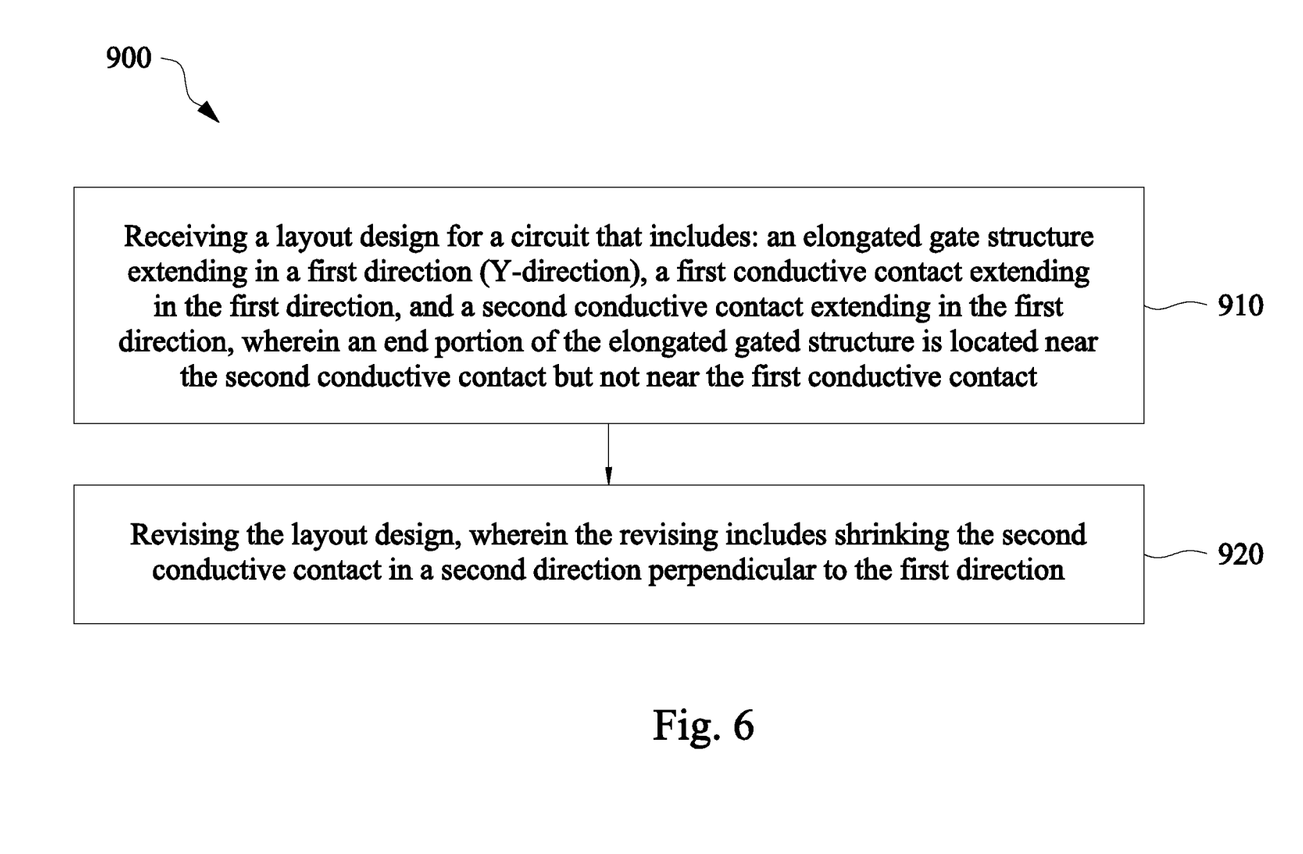
FIG. 6 is a flowchart illustrating a method according to an embodiment of the present disclosure.

FIG. 6 is a flowchart illustrating a method 900 according to an embodiment of the present disclosure. The method 900 includes a step 910, in which a layout design for a circuit is received. The circuit includes: an elongated gate structure extending in a first direction (Y-direction), a first conductive contact extending in the first direction, and a second conductive contact extending in the first direction. An end portion of the elongated gated structure is located near the second conductive contact but not near the first conductive contact.

The method 900 includes a step 920, in which the layout design is received. The revising includes shrinking the second conductive contact in a second direction perpendicular to the first direction.

In some embodiments, the revising the layout design includes generating a photomask design as the revised layout design.

In some embodiments, the receiving the layout design includes receiving a layout design for a static random access memory (SRAM) cell. In some embodiments, the first conductive contact includes a Vcc contact or a BL contact. In some embodiments, the second conductive contact includes a Vss contact or a node contact.

In some embodiments, the shrinking is performed without shrinking the second conductive contact in the first direction.

It is understood that additional processes may be performed before, during, or after the steps 910-920 of the method 900. For example, the method 900 may include a step of fabricating an SRAM device according to the revised layout design. For reasons of simplicity, other additional steps are not discussed herein in detail.

Based on the above discussions, it can be seen that the present disclosure offers advantages over conventional Fin- FET SRAM devices. It is understood, however, that other embodiments may offer additional advantages, and not all advantages are necessarily disclosed herein, and that no particular advantage is required for all embodiments. One advantage is that the present disclosure reduces the gate-to-contact bridging risks. For example, in conventional SRAM cell design, the Vss contact or the node contact may bridge with nearby gate structures as the end portions of these gate structures become enlarged due to process control limitations. The present disclosure reduces the dimensions of the Vss contact or the node contact, so that physical contact with the nearby gate structures is unlikely even if the footprint of the gate structures is enlarged. The reduced bridging risk allows for improved SRAM device and better reliability. Other advantages include compatibility with existing FinFET SRAM design and manufacture, so implementation of the present disclosure is easy and cheap.

One aspect of the present disclosure pertains to a semiconductor device. The semiconductor device includes an elongated gate structure extending in a first direction. The elongated gate structure has a first end portion, a second end portion, and a third portion disposed between the first end portion and the second end portion. The semiconductor device includes a first conductive contact extending in the first direction. The first conductive contact being disposed adjacent to the third portion of the elongated gate structure. The first conductive contact has a first dimension measured in the first direction and a second dimension measured in a second direction perpendicular to the first direction. The semiconductor device includes a second conductive contact extending in the first direction. The second conductive contact being disposed adjacent to the first end portion of the elongated gate structure. The second conductive contact has a third dimension measured in the first direction and a fourth dimension measured in the second direction. The first dimension is less than the third dimension. The second dimension is greater than the fourth dimension. A first fin structure intersects with the elongated gate structure and with the first conductive contact in a top view. A second fin structure intersects with the elongated gate structure and with the second conductive contact in a top view. The first fin structure and the second fin structure each extend in the second direction. The first structure is separated from the second fin structure in the first direction.

Another aspect of the present disclosure pertains to a static random access memory (SRAM) cell. The SRAM cell includes a first gate and a second gate each extending in a first direction. A first gap separates the first gate from the second gate in the first direction. The SRAM cell includes a Vcc contact extending in the first direction. A second gap separates the Vcc contact and the first gate in a second direction perpendicular to the first direction. No segment of the Vcc contact overlaps with the first gap in the first direction. The SRAM cell includes a Vss contact extending in the first direction. A third gap separates the Vss contact from the first gate in the second direction. A segment of the Vss contact is disposed adjacent to the first gap. The Vss contact is smaller than the Vcc contact in the second direction.

Yet another aspect of the present disclosure pertains to a method. A layout design for a circuit is received. The circuit includes: an elongated gate structure extending in a first direction (Y-direction), a first conductive contact extending in the first direction, and a second conductive contact extending in the first direction. An end portion of the elongated gated structure is located near the second conductive contact but not near the first conductive contact. The layout design is revised. The revising includes shrinking the second conductive contact in a second direction perpendicular to the first direction.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure. For example, by implementing different thicknesses for the bit line conductor and word line conductor, one can achieve different resistances for the conductors. However, other techniques to vary the resistances of the metal conductors may also be utilized as well.

What is claimed is:

1. A method, comprising:
receiving a layout design for a static random access memory (SRAM) cell that includes: an elongated gate structure extending in a first direction, a first conductive contact extending in the first direction, and a second conductive contact extending in the first direction, wherein the second conductive contact includes a Vss contact or a node contact, wherein an end portion of the elongated gate structure is located near the second conductive contact but not near the first conductive contact, wherein the second conductive contact extends farther in the first direction than either the first conductive contact or the elongated gate structure, wherein the receiving the layout design comprises receiving a graphical database system (GDS) file; and
revising the layout design, wherein the revising includes shrinking the second conductive contact in a second direction perpendicular to the first direction, such that an aspect ratio of the second conductive contact is changed, the aspect ratio being a ratio of: a first dimension of the second conductive contact in the first direction and a second dimension of the second conductive contact in the second direction.

2. The method of claim 1, wherein the revising the layout design includes generating a photomask design as the revised layout design.

3. The method of claim 1, further comprising: facilitating a fabrication of an integrated circuit (IC) device according to the revised layout design.

4. The method of claim 1, wherein:
the first conductive contact includes a Vcc contact or a BL contact.

5. The method of claim 1, wherein the shrinking is performed without shrinking the second conductive contact in the first direction.

6. The method of claim 1, wherein:
the shrinking is applied to a first side of the second conductive contact but not to a second side of the second conductive contact;
the first side and second side are opposite one another; and
the first side faces the end portion of the elongated gate structure.

7. The method of claim 1, wherein:
the shrinking is applied to a first side of the second conductive contact and a second side of the second conductive contact;

the first side and second side are opposite one another; and
the first side faces the end portion of the elongated gate structure.

8. The method of claim 1, wherein the revising is performed without affecting dimensions of the first conductive contact in both the first direction and the second direction.

9. The method of claim 1, wherein:
the elongated gate structure is a first elongated gate structure;
the layout design further includes a second elongated gate structure that extends in the first direction and is separated from the first elongated gate structure by a gap; and
the shrinking of the second conductive contact increases a distance between the gap and the second conductive contact.

10. A method, comprising:
receiving a computer file, the computer file specifying a layout for a static random access memory (SRAM) circuit that includes:
a first gate extending in a first direction;
a second gate extending in the first direction;
a first contact extending in the first direction; and
a second contact extending in the first direction, wherein the second contact includes a Vss contact or a node contact of the SRAM circuit, wherein an end portion of the first gate is located near the second contact but not near the first contact, wherein the second contact extends farther in the first direction than either the first contact or the first gate; and
generating a photomask design based on the computer file, wherein the second contact in the photomask design has a second size that is less than the first size in a second direction different from the first direction, and wherein the second contact in the photomask design has a different aspect ratio than the second contact in the layout specified in the computer file.

11. The method of claim 10, wherein the receiving of the computer file comprises receiving a computer file in a graphical database system (GDS) format, and wherein the first contact and the second contact are separated from each other in the first direction.

12. The method of claim 10, wherein the generating the photomask design is performed without reducing a size of the second contact in the first direction.

13. The method of claim 10, wherein the first contact includes a Vcc contact or a plurality of bit-line (BL) contact.

14. The method of claim 13, wherein the first contact is the Vcc contact, wherein the second contact is the Vss contact, and wherein the generating of the photomask design comprises reducing a size of the Vss contact as the second contact in the second direction without affecting a size of the Vcc contact in either the first direction or the second direction.

15. The method of claim 14, wherein the second contact is the Vss contact, wherein the SRAM circuit further include a plurality of node contacts, and wherein the generating of the photomask design further comprises reducing a size of at least one of the node contacts in the second direction.

16. The method of claim 15, wherein the reducing the size of the at least one of the node contacts comprises reducing a size of a first node contact from a first side and reducing a size of a second node contact from a second side opposite the first side.

17. A method, comprising:
receiving a first integrated circuit (IC) layout design that specifies a layout for a static random access memory (SRAM) device that includes:
a first gate extending in a first direction;
a second gate extending in the first direction, the second gate being separated from the first gate in the first direction by a first gap;
a Vcc contact extending in the first direction; and
a Vss contact extending in the first direction, wherein an end portion of the first gate is located near the Vss contact but not near the Vcc contact, wherein the Vss contact extends farther in the first direction than either the Vcc contact or the first gate; and
generating a second IC layout design based on the first IC layout design, wherein the second IC layout design is generated at least in part by shrinking a dimension of the Vss contact in a second direction different from the first direction without affecting a dimension of the Vss contact in the first direction.

18. The method of claim 17, wherein the generating of the second IC layout design is performed without affecting dimensions of the Vcc contact in either the first direction or the second direction.

19. The method of claim 17, wherein:
the SRAM device further includes a first node contact and a second node contact each extending in the first direction; and
the generating of the second IC layout design comprises shrinking dimensions of both the first node contact and the second node contact in the second direction.

20. The method of claim 17, wherein the first integrated circuit (IC) layout design comprises a graphical database system (GDS) file.

* * * * *